United States Patent [19]

Mezrich

[11] 4,222,008
[45] Sep. 9, 1980

[54] APPARATUS FOR DIVIDING AN ARBITRARY WAVEFORM INTO EQUAL-AMPLITUDE STEPS

[75] Inventor: Reuben S. Mezrich, Rock Hill, N.J.

[73] Assignee: RCA Corporation, New York, N.Y.

[21] Appl. No.: 940,572

[22] Filed: Sep. 8, 1978

[51] Int. Cl.² .............................................. H03K 5/08
[52] U.S. Cl. ........................................ 328/28; 328/29;
328/31; 328/132; 328/151
[58] Field of Search .................... 328/28, 29, 30, 132, 328/151, 31; 307/353

[56] References Cited

U.S. PATENT DOCUMENTS

| 3,628,058 | 12/1971 | Espe | 328/151 |
| 3,638,183 | 1/1972 | Progler et al. | 307/353 |
| 3,717,818 | 2/1973 | Herbst | 307/353 |
| 3,753,133 | 8/1973 | Shumate, Jr. | 328/28 |
| 3,815,032 | 6/1974 | Parker et al. | 328/151 |
| 4,091,297 | 5/1978 | Stephens | 307/353 |

*Primary Examiner*—Saxfield Chatmon, Jr.
*Attorney, Agent, or Firm*—Samuel Cohen; George J. Seligsohn

[57] ABSTRACT

A control pulse is generated whenever the instantaneous amplitude of an arbitrary-waveform input signal differs by a fixed increment from that of a preceding sample of the input signal. The input signal is resampled in response to the control pulse and the whole operation is repeated.

3 Claims, 5 Drawing Figures

APPARATUS FOR DIVIDING AN ARBITRARY WAVEFORM INTO EQUAL-AMPLITUDE STEPS

This invention relates to apparatus for deriving a given signal indicative of the occurrence of a number of fixed incremental changes in the instantaneous amplitude of an input signal having an arbitrary waveform.

It is conventional to employ clock pulses having a specified repetition period to sample the instantaneous amplitude of an input signal having any arbitrary waveform at the end of each successive clock period. In this case, time is the independent variable and the amplitude of the arbitrary-waveform input signal is the dependent variable. There are cases, however, in which it is necessary or desirable to employ the amplitude of the arbitrary-waveform input signal as the independent variable and to employ time as the dependent variable. The present invention is concerned with these latter cases.

For instance, in a particular ultrasonic imaging system, the object to be imaged is ultrasonically scanned linearly at a fast rate in the X (horizontal) direction and is scanned non-linearly (sinusoidally) at a slow rate in the Y (vertical) direction. An image of the ultrasonically scanned object is displayed on a CRT, which is raster scanned in synchronism with the ultrasonic scan of the object. If the successive horizontal scans of the object CRT were initiated at fixed time increments (as is conventional in television), the distance between successive horizontal scans would vary sinusoidally, rather than being constant. This would provide excessive sampling at the top and bottom of the scanned object, where the slope of the sinusoidal waveform approaches zero, and would provide insufficient sampling in the vicinity of the middle of the scanned object, where the sinusoidal waveform has its maximum slope. In this case, use of apparatus embodying the present invention provides a simple, inexpensive way of providing equidistant successive horizontal scans, despite the fact that the vertical scan is sinusoidal and despite the fact that there may be as many as several hundred horizontal scans per frame.

Briefly, apparatus embodying the present invention comprises sample and hold means that, in response to an applied control pulse, samples the then-existing instantaneous amplitude of an applied input signal. The sample and hold means continuously derives a fixed output level substantially equal in amplitude to the preceding sampled instantaneous amplitude. A difference circuit provides an output proportional to the difference between the continuously changing instantaneous amplitude of the input signal and the fixed output level from the sample and hold means. A signal level fixed increment detector produces a given signal when the instantaneous amplitude of the output from the difference circuit achieves a fixed increment in level, with at least a certain one of positive and negative polarities. This given signal is indicative of the occurrence of a fixed incremental change, in at least the certain ones of positive and negative directions, of the instantaneous amplitude of the input signal. A control pulse generator, in response to this given signal, generates a control pulse, which control pulse is coupled back to the sample and hold means to effect the next sampling of the instantaneous amplitude which now exists of the input signal.

Figure 1:
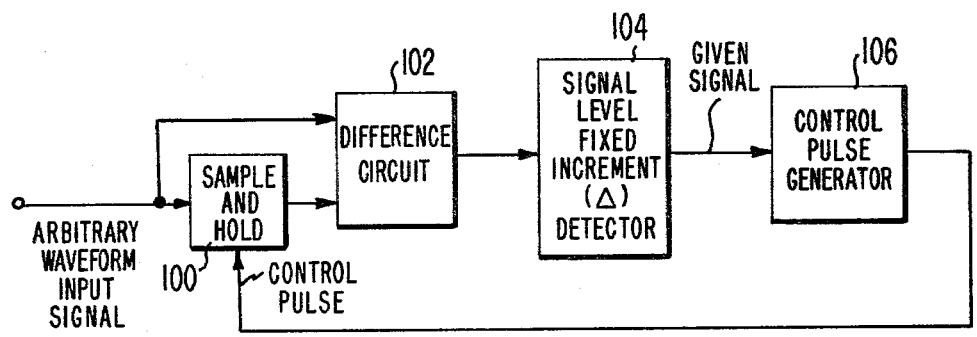
FIG. 1 is a functional block diagram of apparatus embodying the present invention.

Referring to FIG. 1, there is shown sample and hold means 100, difference circuit 102, signal-level fixed increment detector 104 and control pulse generator 106. An arbitrary-waveform input signal (which may have a predetermined shape, such as sinusoidal, or which may vary in some unpredictable way, such as an information signal) waveform is applied through first coupling means both as a signal input to sample and hold means 100 and also as a first input to difference circuit 102. The output from sample and hold means 100 is applied through second coupling means as a second input to difference circuit 102. The output from difference circuit 102 is applied by third coupling means as a signal input to signal-level fixed increment detector 104. The output from signal-level fixed increment detector 104 constitutes a given signal, which is applied as an input to control pulse generator 106. Control pulse generator 106 generates control pulses, which are applied by fourth coupling means as a control input to sample-and-hold means 100.

As known in the art, a sample and hold means includes a normally-closed sampling gate which is opened only during the occurrence of an applied control pulse. The sample and hold means further includes means for sampling, during the occurrence of a control pulse, the then-existing instantaneous amplitude of an applied input signal to the sample and hold means, and then storing the level of the sample. Therefore, the sample and hold means continuously derives a fixed output level substantially equal in amplitude to the sampled instantaneous amplitude. This fixed output level remains until the next sample, which occurs in response to the next control pulse.

Difference circuit 102 is any circuit, such as a differential amplifier, which produces an output having an instantaneous amplitude proportional to the difference between the respective instantaneous amplitudes of the two inputs thereto. Thus, difference circuit 102 produces an output having an instantaneous amplitude at any particular moment which is proportional to the change (increment) achieved in the instantaneous amplitude of the arbitrary-waveform input signal at that particular moment with respect to the instantaneous amlitude of the arbitrary-waveform input signal when it was last sampled. (The term "increment", as used herein, shall be construed in the mathematical sense of "any change, positive, negative, or zero, in an independent variable".)

Signal-level fixed increment detector 104 (which may include one or two comparators, shown in FIG. 2, discussed below) produces a given signal output which is indicative of the aforesaid increment in the instantaneous amplitude of the arbitrary-waveform input signal achieving a certain fixed increment. This fixed increment may be an increment of only a certain one of two polarities having a given magnitude. Alternatively, this fixed increment may be either an increment of one polarity having a first predetermined magnitude or an increment of opposite polarity having a second predetermined magnitude. Further, the first and second predetermined magnitudes may be substantially equal or they may be unequal.

Control pulse generator 106, in response to the given signal applied to an input thereto, generates a control pulse whenever a fixed increment is detected by detector 104. The control pulse from control pulse generator 106 reopens the sampling gate of sample and hold means 100, so that the fixed output level changes by an amount substantially equal to the amount of the fixed increment detected by detector 104. The whole operation is then repeated.

Figure 2:
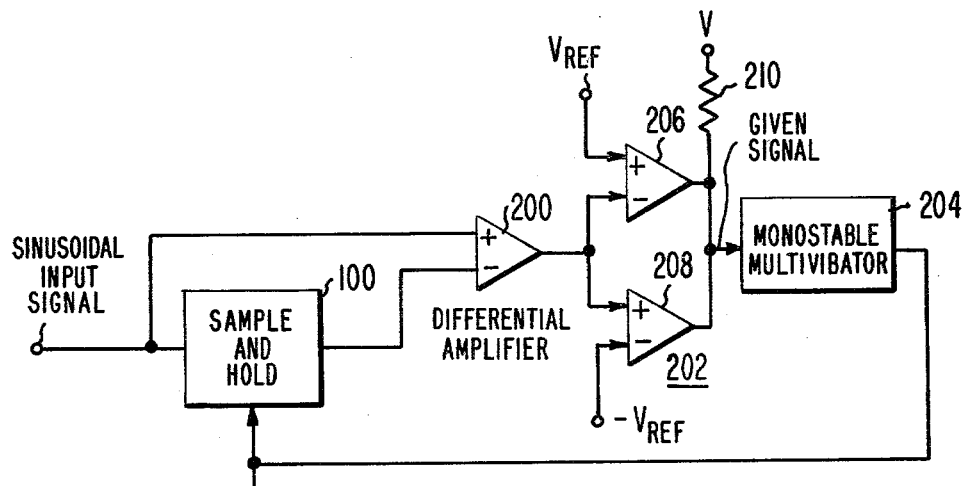
FIG. 2 is a schematic diagram of a preferred embodiment of the present invention.

FIG. 2 shows a specific embodiment of the present invention, which is particularly suitable for generating horizontal-scan synchronization pulses for use in an ultrasonic imaging system, of the type discussed above, which employs a sinusoidal, rather than a linear, vertical scan. In FIG. 2, differential amplifier 200, comparators 202 and monostable multi-vibrator 204, respectively, correspond in function to difference circuit 102, signal-level fixed increment detector 104 and control pulse generator 106, respectively, of FIG. 1.

Figure 3:
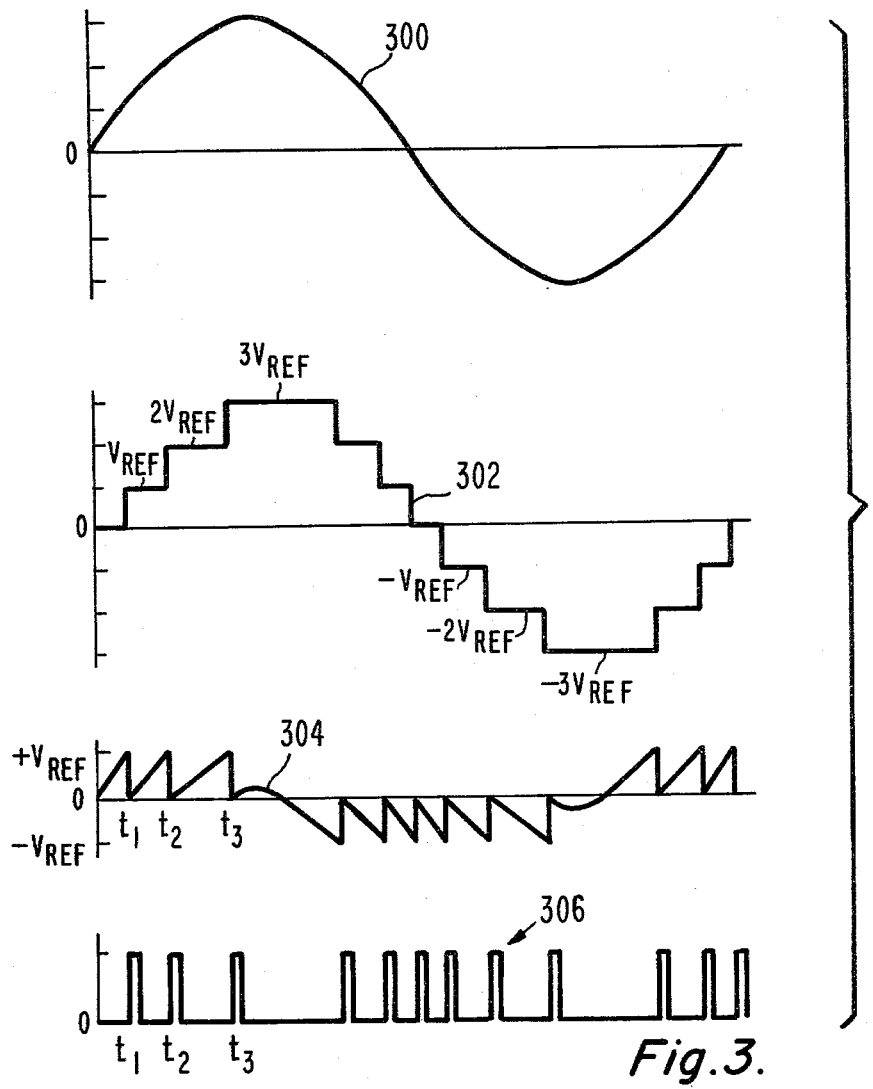
FIG. 3 illustrates timing diagrams helpful in explaining the operation of the embodiment shown in FIG. 2, and FIGS. 4a and 4b show respective modifications of the embodiment of FIG. 2.
Figure 4:
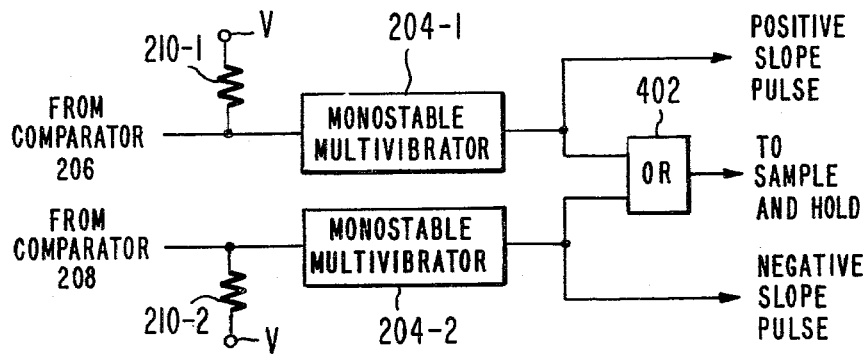

The description of the operation of FIG. 2, which follows, makes use of the timing diagrams of FIG. 3. In FIG. 2, the arbitrary-waveform input signal of FIG. 1 is a sinusoidal waveform. As shown in timing diagram 300 of the sinuosoidal waveform, at time zero, the instantaneous amplitude of the sinusoidal input signal applied to the positive input to differential amplifier 200, is zero. Also, as shown in timing diagram 302 of the fixed output level from sample and hold means 100, at time zero this fixed output level, applied to the negative input to differential amplifier 200, is also zero. Therefore, as shown in timing diagram 304 of the output from differential amplifier 200, at time zero the output from differential amplifier 200 is also zero.

However, as time passes, the instantaneous amplitude of the sinusoidal input signal applied to the positive input of differential amplifier 200 increase, while the voltage applied to the negative input to the differential amplifier 200 from sample and hold means 100 remains at zero. Therefore, the instantaneous amplitude of the output from differential amplifier 200 rises, as shown in timing diagram 304.

Comparators 202 comprise first comparator 206 and second comparator 208, which share a common output load resistance 210. Comparator 206 compares the instantaneous amplitude of the output of differential amplifier 200 with a positive fixed-level reference voltage ($V_{REF}$) equal to a given incremental value, while comparator 208 compares the instantaneous amplitude of the output from differential amplifier 200 with a negative fixed-level reference voltage ($-V_{REF}$) substantially equal in absolute magnitude fo this same given incremental value. Therefore, comparator 206 produces a given-signal output across resistance 210 when the rising instantaneous amplitude of the output from differential amplifier 200 reaches the point at which it is equal to the positive fixed-level reference signal. In response to this given signal, monostable multivibrator 204 generates an output pulse of predetermined width which may be employed as a horizontal-scan synchronization pulse in the aforesaid type of ultrasonic imaging system. In addition, the output pulse is applied as a control pulse to sample and hold means 100, causing the fixed output level of sample and hold means 100 to rise to the instantaneous amplitude which now exists of the sinusoidal input signal; i.e., a level substantially equal to that of the positive fixed-level reference voltage. This is true because the predetermined width of the output pulse of monostable multivibrator 204 provides a sampling period sufficiently long to permit the output from sample and hold means 100 to reach a level substantially equal to that of the then-existing instantaneous amplitude of the sinusoidal input signal thereto, which is now equal to the positive fixed-level reference voltage.

Comparator 206 is effective in providing the given signal to monostable multivibrator 204 only during the first and last quarter-cycles of sinusoidal input signal 300, when sinusoidal input signal 300 has a positive slope. During the second and third quarter-cycles of the sinusoidal input signal 300, when the sinusoidal input signal 300 has a negative slope, comparator 208 is effective in providing the given signal input to monostable multivibrator 204. This rsults, during each complete cycle of the sinusoidal input signal 300, in the output from sample and hold means 100 forming the staircase wave shown in timing diagram 302, and the output from differential amplifier 200 producing the waveform shown in diagram 304. Further, during a complete cycle of sinusoidal input signal 300, monostable multivibrator 204 generates a sequence 306 of variably-spaced output pulses which are indicative of achieving each successive fixed increment in signal-level in the instantaneous amplifier of sinusoidal input signal 300.

Various modifications may be made in the arrangement shown in FIG. 2. For instance, the fixed level of the positive reference voltage through comparator 206 could be made different from the fixed level of the negative reference voltage to comparator 208, if desired. If only positive increments or only negative increments are to be detected, the appropriate one of comparators 206 or 208 can be omitted.

Figure 4A:
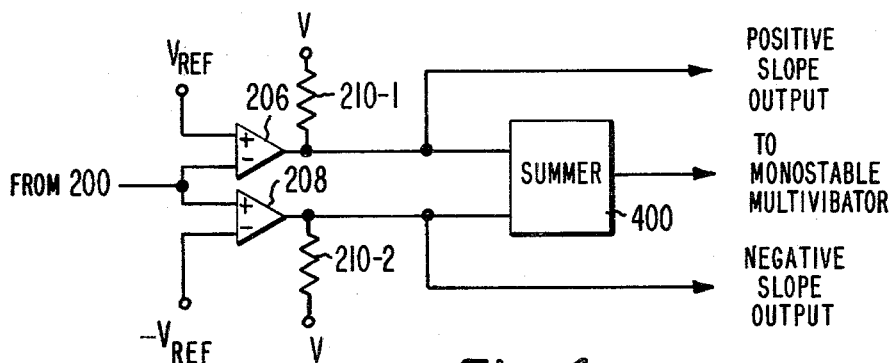

In the arrangement of FIG. 2, the summing of the outputs of comparators 206 and 208 is accomplished by common load resistance 210. In an alternative arrangement, shown in FIG. 4a, comparator 206 has its own load resistance 210-1 and comparator 208 has its own load resistance 210-2. Summing, in the arrangement shown in FIG. 4a, is accomplished by a separate summer 400, in which the input thereto from comparator 206 is electrically isolated from the input thereto from comparator 208. The benefit of the arrangement shown in FIG. 4a is that the output of comparator 206, which represents positive slope information, remains distinct from the output from comparator 208, which represents negative slope information.

Another modification is shown in FIG. 4b. The arrangement of FIG. 4b is similar to that of FIG. 4a to the extent that comparators 206 and 208 employ separate load resistances 210-1 and 210-2. However, in the case of FIG. 4b, summer 400 is omitted and, instead, monostable multivibrator 204 is replaced with separate monostable multivibrators 204-1 and 204-2. As shown in FIG. 4b, the output from comparator 206 causes monostable multivibrator 204-1 to provide a pulse output corresponding only to positive slope information. In a similar manner, the output from comparator 208 causes monostable multivibrator 204-2 to provide a pulse output corresponding to only negative slope information. Therefore, the positive slope information and negative slope information remain distinct. However, the sample and hold means 100 requires control pulses for both positive and negative slope information. Therefore, in the arrangement of FIG. 4b, OR gate 402 combines the positive slope and negative slope pulses for use as the control pulses applied to sample and hold means 100.

The present invention has other uses than that of generating horizontal scan synchronization pulses when the vertical scan is non-linear. By way of example, the present invention may also be employed usefully as a delta modulator.

What is claimed is:

1. Apparatus for deriving a given signal indicative of the occurrence of each fixed incremental change, in at least a certain one of positive and negative directions, of the instantaneous amplitude of an input signal having an arbitrary waveform; said apparatus comprising:

sample and hold means responsive to an applied control pulse for sampling the then-existing instantaneous amplitude of said signal input applied thereto to continuously derive a fixed output level substantially equal in amplitude to said sampled instantaneous amplitude, a difference circuit for deriving an output having an instantaneous amplitude substantially proportional to the difference in the instantaneous amplitudes of respective first and second inputs thereto, wherein said difference circuit comprises a differential amplifier, first coupling means for applying said arbitrary-waveform input signal as said signal input to said sample and hold means and also as said first input to said difference circuit, second coupling means for applying said fixed level output from said sample and hold means as said second input to said difference circuit, a signal level fixed increment detector responsive to the instantaneous amplitude of a signal input thereto achieving a fixed increment in level, with at least said certain one of positive and negative polarities, for producing said given signal, wherein said signal level fixed increment detector includes at least one comparator for comparing the instantaneous amplitude of the output of said differential amplifier with a fixed amplitude of a reference signal of said certain one of said polarities to produce as said given signal a waveform having a characteristic indicative of the instantaneous amplitude of the output of said differertial amplifier becoming substantially equal to said fixed amplitude of said reference signal, third coupling means for applying said output from said difference circuit as said signal input to said signal level fixed increment detector, a control pulse generator having said given signal applied as an input thereto for generating control pulse whenever a fixed incremental change, in at least said certain one of said positive and negative directions, of the instantaneous amplitude of said arbitrary waveform input signal occurs, and fourth coupling means for applying control pulses from said control pulse generator to said sample and hold means.

2. The apparatus defined in claim 1, wherein said signal level fixed increment detector also includes another comparator for comparing the instantaneous amplitude of the output of said differential amplifier with a second fixed amplitude of a second reference signal of a polarity opposite to said certain one of said polarities to also produce as said given signal a second waveform having a characteristic indicative of the instantaneous amplitude of the output of said differential amplifier becoming substantially equal to said second fixed amplitude of said second reference signal.

3. The apparatus defined in claim 2, wherein the absolute value of said second fixed amplitude is substantially equal to the absolute value of said first mentioned fixed amplitude.

* * * * *

UNITED STATES PATENT AND TRADEMARK OFFICE
CERTIFICATE OF CORRECTION

PATENT NO. : 4,222,008
DATED : September 9, 1980
INVENTOR(S) : Reuben Saul Mezrich It is certified that error appears in the above-identified patent and that said Letters Patent is hereby corrected as shown below:

Title page below "[22] Filed: September 8, 1978" insert ---[30] Foreign Application Priority Data, September 14, 1977, United Kingdom, 38436/77---.

Column 2, line 54, "amli" should be ---ample---.
Column 3, line 7, "to" should be ---as---.
Column 3, line 56, "fo" should be ---to---.
Column 4, line 19, "rsults" should be ---results---.

Signed and Sealed this

Twenty-fifth Day of November 1980

[SEAL]

Attest:

SIDNEY A. DIAMOND

Attesting Officer     Commissioner of Patents and Trademarks